(12) United States Patent
Amemiya et al.

(10) Patent No.: US 7,271,875 B2
(45) Date of Patent: Sep. 18, 2007

(54) ALIGNMENT APPARATUS, EXPOSURE APPARATUS AND DEVICE FABRICATION METHOD

(75) Inventors: Mitsuaki Amemiya, Saitama (JP); Masahito Shinohara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 84 days.

(21) Appl. No.: 11/214,252

(22) Filed: Aug. 29, 2005

(65) Prior Publication Data

US 2006/0044538 A1    Mar. 2, 2006

(30) Foreign Application Priority Data

Aug. 31, 2004   (JP) .............................. 2004-253185

(51) Int. Cl.
*G03B 27/52* (2006.01)
*G03B 27/42* (2006.01)

(52) U.S. Cl. .......................................... 355/55; 355/53

(58) Field of Classification Search ................ 355/53, 355/55, 67, 69; 250/548; 356/399–401
See application file for complete search history.

(56) References Cited

U.S. PATENT DOCUMENTS

| 6,130,431 A * | 10/2000 | Berger ........................ 250/372 |
| 6,333,776 B1 * | 12/2001 | Taniguchi .................... 355/52 |
| 2002/0101574 A1 * | 8/2002 | Tsuji .......................... 355/69 |

FOREIGN PATENT DOCUMENTS

JP   2003-409881   12/2003

\* cited by examiner

*Primary Examiner*—Henry Hung Nguyen
(74) *Attorney, Agent, or Firm*—Morgan & Finnegan, LLP

(57) ABSTRACT

An alignment apparatus for aligning with each other a mask stage that supports a mask that has an exposure pattern and a wafer stage that supports an object by using a light with wavelength of 1 nm to 50 nm, said alignment apparatus including a substrate for forming a first reference pattern similar to a second reference pattern formed on the mask or the mask stage, and a detection part for detecting a light from the substrate, wherein said substrate and detection part form a hollow housing, in which a gas is filled.

12 Claims, 8 Drawing Sheets

ALIGNMENT APPARATUS, EXPOSURE APPARATUS AND DEVICE FABRICATION METHOD

BACKGROUND OF THE INVENTION

The present invention relates generally to an alignment apparatus, and more particularly to an alignment apparatus for aligning with each other a wafer and a mask in an exposure apparatus. The present invention is suitable for an alignment apparatus used for an exposure apparatus that uses extreme ultraviolet ("EUV") light as a light source for exposure.

Recent high performance and inexpensive electronic apparatuses need more economic and precisely manufactured semiconductors installed in them. Therefore, a high accuracy and efficiency manufacture are demand for an exposure apparatus that exposes a circuit pattern of the semiconductor. Then, the exposure apparatus includes an alignment apparatus that aligns with each other a mask and a wafer to execute high accuracy alignment and microfabrication.

The alignment apparatus reflects or transmits a light to a reference pattern formed on a mask, and the reflected light or transmitted light incident upon a slit support substrate that has a slit similar to the reference pattern. Moreover, the alignment apparatus detects the incident light to the slit by a photo-diode, and aligns with each other the mask and wafer based on the detection result. Recently, an EUV light is used as exposure light by a shorter wavelength of the exposure light.

However, the wavelength of the EUV light is one digit or more shorter than an ultraviolet light, and the slit support substrate that has high transmittance for the EUV light is not obtained.

A method of thinning the slit support substrate and a method of directly patterning to the photo-diode without using the slit support substrate are proposed as a method of solving this problem. See, for example, U.S. Pat. No. 6,130,431.

However, if the slit support substrate is thinned, a heat of the EUV light causes a distortion of the slit support substrate. In this case, a volume of the slit support substrate becomes small by thinning the slit support substrate, the heat quantity generated by absorbing the EUV light does not exhaust easily, the temperature rises, and the distortion is caused. Then, the distortion caused in the slit support substrate generates an alignment error, distortion and defocus error, and the detection accuracy is decreased. As a result, when the EUV light is used, a high accuracy alignment is difficult in the conventional alignment apparatus.

Moreover, the structure as U.S. Pat. No. 6,130,431 has a possibility to damage a surface of the photo-diode. As a result, when the EUV light is used, a high accuracy alignment is difficult in the conventional alignment apparatus.

BRIEF SUMMARY OF THE INVENTION

Accordingly, the present invention is directed to an alignment apparatus that can maintain high throughput and enables high accuracy alignment when the EUV light is used.

An alignment apparatus of one aspect according to the present invention for aligning with each other a mask stage that supports a mask that has an exposure pattern and a wafer stage that supports an object by using a light with wavelength of 1 nm to 50 nm, said alignment apparatus including a substrate for forming a first reference pattern similar to a second reference pattern formed on the mask or the mask stage, and a detection part for detecting a light from the substrate, wherein said substrate and detection part form a hollow housing, in which a gas is filled.

An alignment apparatus of another aspect according to the present invention for aligning with each other a mask stage that supports a mask that has an exposure pattern and a wafer stage that supports an object by using a light with wavelength of 1 nm to 50 nm, said alignment apparatus including a substrate for forming a first reference pattern similar to a second reference pattern formed on the mask or the mask stage, a detection part for detecting a light from the substrate, and an attenuating part for attenuating an incident light to the substrate, wherein said substrate and detection part forms a hollow housing, in which a gas is filled, and the substrate is arranged in the housing.

An alignment apparatus of another aspect according to the present invention for aligning with each other a mask stage that supports a mask that has an exposure pattern and a wafer stage that supports an object by using a light with wavelength of 1 nm to 50 nm, said alignment apparatus including a substrate for forming a first reference pattern similar to a second reference pattern formed on the mask or the mask stage, a detection part for detecting a light from the substrate, and an attenuating part for attenuating an incident light to the substrate, wherein a gas is introduced into between the substrate and the attenuating part.

An exposure apparatus of another aspect according to the present invention for exposing a pattern of a mask supported by a mask stage onto an object supported by a wafer stage, said exposure apparatus including an alignment apparatus for aligning with each other the mask stage and the wafer stage, wherein said alignment apparatus includes a substrate for forming a first reference pattern similar to a second reference pattern formed on the mask or the mask stage, and a detection part for detecting a light from the substrate, wherein said substrate and detection part forms a hollow housing, in which a gas is filled.

An exposure apparatus of another aspect according to the present invention for exposing a pattern of a mask supported by a mask stage onto an object supported by a wafer stage, said exposure apparatus including an alignment apparatus for aligning with each other the mask stage and the wafer stage, wherein said alignment apparatus includes a substrate for forming a first reference pattern similar to a second reference pattern formed on the mask or the mask stage, a detection part for detecting a light from the substrate, and an attenuating part for attenuating an incident light to the substrate, wherein said substrate and detection part forms a hollow housing, in which a gas is filled, and the substrate is arranged in the housing.

An exposure apparatus of another aspect according to the present invention for exposing a pattern of a mask supported by a mask stage onto an object supported by a wafer stage, said exposure apparatus including an alignment apparatus for aligning with each other the mask stage and the wafer stage, a substrate for forming a first reference pattern similar to a second reference pattern formed on the mask or the mask stage, a detection part for detecting a light from the substrate, and an attenuating part for attenuating an incident light to the substrate, wherein a gas is introduced into between the substrate and the attenuating part.

A device fabrication method of another aspect according to the present invention includes the steps of exposing an object using an exposure apparatus, and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, wherein said alignment apparatus includes a substrate for forming a first reference pattern similar to a second reference pattern formed on the mask or the mask stage, and a detection part for detecting a light from the substrate, wherein said substrate and detection part forms a hollow housing, in which a gas is filled.

A device fabrication method of another aspect according to the present invention includes the steps of exposing an object using an exposure apparatus, and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, wherein said alignment apparatus includes a substrate for forming a first reference pattern similar to a second reference pattern formed on the mask or the mask stage, a detection part for detecting a light from the substrate, and an attenuating part for attenuating an incident light to the substrate, wherein said substrate and detection part forms a hollow housing, in which a gas is filled, and the substrate is arranged in the housing.

A device fabrication method of another aspect according to the present invention includes the steps of exposing an object using an exposure apparatus, and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, a substrate for forming a first reference pattern similar to a second reference pattern formed on the mask or the mask stage, a detection part for detecting a light from the substrate, and an attenuating part for attenuating an incident light to the substrate, wherein a gas is introduced into between the substrate and the attenuating part.

Other objects and further features of the present invention will become readily apparent from the following description of the preferred embodiments with reference to accompanying drawings.

DETAILED DESCRIPTION OF THE PREFERRED EMBODIMENTS

Figure 1:
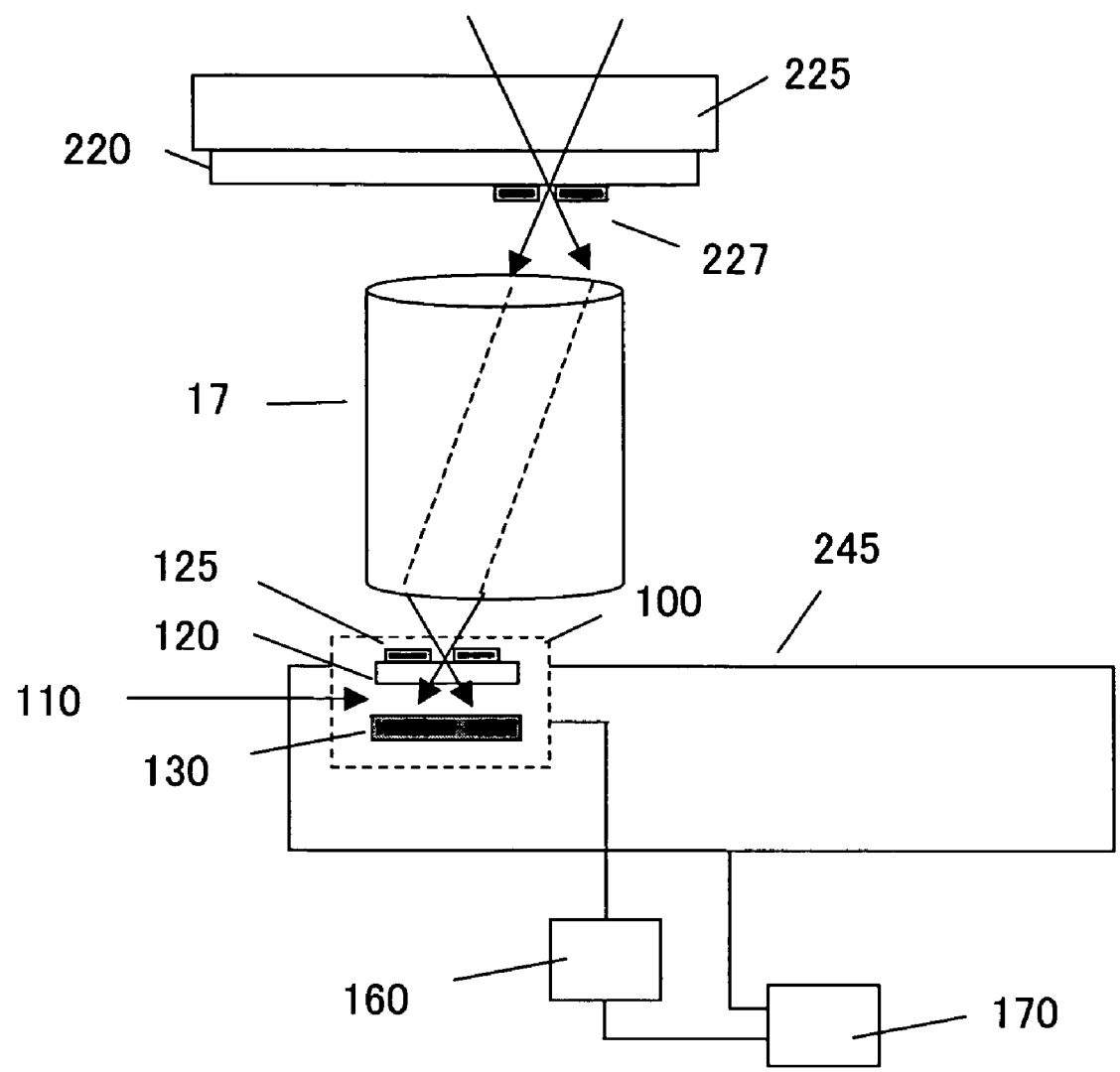
FIG. 1 is a schematic sectional view of an alignment apparatus.
Figure 2:
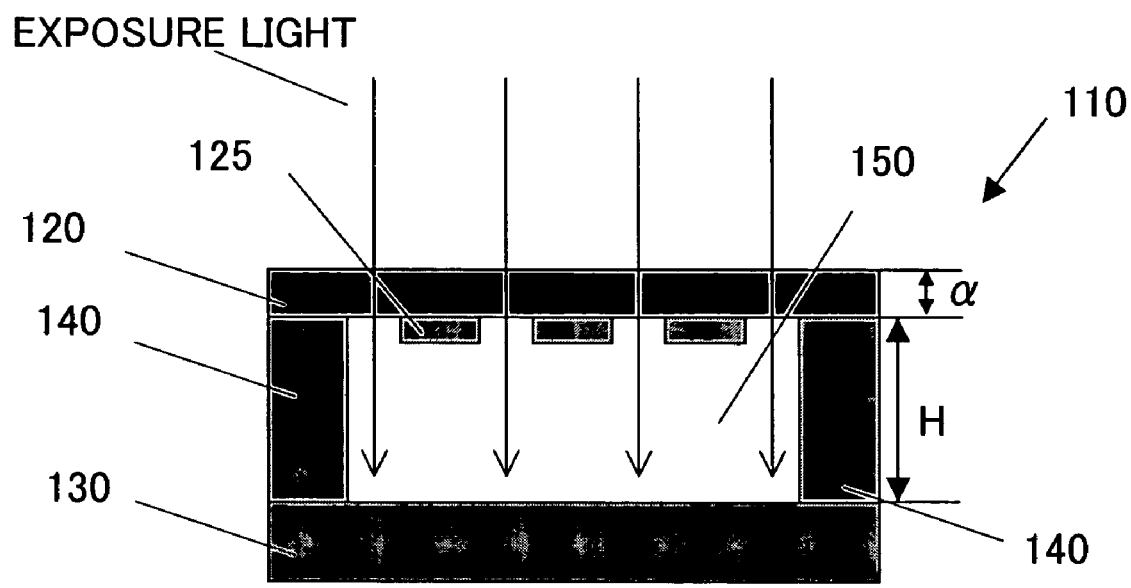
FIG. 2 is a partially enlarged sectional view of the alignment apparatus of FIG. 1.

Exemplary embodiments will now be described in detail in accordance with the accompanying drawings. In each figure, the same reference numeral denotes the same element. Therefore, a duplicate description will be omitted. Here, FIG. 1 is a structure view of the alignment apparatus 100. FIG. 2 is a partially enlarged structure view of the alignment apparatus 100.

The alignment apparatus 100 aligns with each other a mask stage 225 that supports a mask 220 and a wafer stage 245 that supports an object (wafer 240) described later. The mask 220 has an exposure pattern illuminated by a light with wavelength from 1 nm to 50 nm. The alignment apparatus 100 includes a detection apparatus 110, a gas 150, a gas detection part 160, and a controller 170. Moreover, the alignment apparatus 100 is formed on the wafer stage 240 described later, and is driven while synchronizing with the wafer stage 245.

The detection apparatus 110 detects a relative position between the mask stage 225 that supports the mask 220 and the wafer stage 245 that supports the object (wafer 240). The detection apparatus 110 includes a slit support substrate 120, a slit 125, a detection part 130, a member 140, and the gas 150. Moreover, the detection apparatus 110 forms a hollow housing by using the slit support substrate 120, the detection part 130, and the member 140. An inlet (not shown) that introduces and exhausts the gas 150 is formed on the housing. In this case, the inlet may be respectively different openings as for the introduction and the exhaust. Moreover, a sealing lid (not shown) that opens and shuts the inlet is installed in the housing. The housing can maintain a pressure in the housing to a desired pressure by the sealing lid.

The detection apparatus 110 of the instant embodiment introduces the gas 150 in the housing. Therefore, the detection apparatus 110 can exhaust a heat that causes the distortion of the slit support substrate 120 by the gas 150, and decrease a rise in temperature of the slit support substrate 120. As a result, when the EUV light is used, the alignment apparatus 100 can maintain high throughput and enables high accuracy alignment.

The slit support substrate 120 transmits the EUV light, is formed on the mask 220, and has a first reference pattern (slit 125) similar to a second reference pattern (reference pattern 227) used for the alignment. A material of the slit support substrate 120 is selected from materials that transmit the exposure light. In this case, SiC is used as the material of the slit support substrate 120.

A visible light and ultraviolet light etc., that has been used to the exposure apparatus has a same level energy as an outermost electron of an atom that composes the material, and is absorbed to the outermost electron when absorbed to the material. An energy level of the outermost electron changes by a chemical bound state of the material. Therefore, if a chemical structure of the material is changed, a material that transmits the exposure light can be obtained. Actually, if the slit support substrate is made by the same material as the lens and the mask, the slit support substrate transmits a lot of the exposure light.

However, an absorption factor of the material is decided by absorbing an inner shell electron while not contributing to the chemical bond in the EUV light. Therefore, although the absorption factor does not change, the chemical bond state of the material changes, and the absorption factor is decided by an element that composes the material. Then, it is very difficult to obtain the slit support substrate 120 that has high transmittance for the EUV light. As a result, it is necessary to thin the slit support substrate 120 to obtain an enough transmittance necessary for the detection.

Therefore, a thickness a of the slit support substrate 120 is desirable to be reduced because the EUV light is used, for instant, is reduced to about 0.2 μm.

Here, a detail description will now to be given of the inner shell electron and the outer shell electron as a supplement. As above-mentioned, a characteristic of the material, especially, an influence given to the absorption of the light is remarkably different between the inner shell electron and the outer shell electron.

The inner shell electron has a high energy level, becomes a low energy level while locating from a core to an outside, and becomes the outer shell electron. Generally, the energy level of the outer shell electron is 10 eV or less, and the smallest is about 20 eV among the energy level of the inner shell electron. Therefore, the electron of the energy level with higher than about 20 eV does not contribute to the chemical bond, and the energy level does not change by the bond state.

For example, the smallest energy level is 24 eV of $L_I$ shell among the energy level of the inner shell electron for oxygen O. The oxygen O has K shell, $L_I$ shell, $L_{II}$ shell, and $L_{III}$ shell in all. Then, the energy level is respectively 532 eV, 24 eV, and 7 eV. The shell that contributes to the chemical bond among these is $L_I$ shell and $L_{II}$ shell, and K shell and $L_I$ shell are the inner shell that does not change the energy level by the chemical bond. When the material absorbs the light, the light with the energy of 532 eV or more is almost absorbed by K shell, and the light with the energy of 24 eV to 532 eV is almost absorbed by $L_I$ shell. Because the LI shell and the LII shell absorb the light with the energy of 24 eV or less, the absorption factor is different according to the bond state.

Therefore, the transmittance of the material for the light with the energy of 24 eV or more, in other words, the light with short wavelength of 50 nm or less may consider the structure element of the material. On the other hand, the light with long wavelength 50 nm or more has a possibility that the transmittance changes by the structure element of the material and the bond state.

Moreover, in the absorption of the inner shell electron, the transmittance of the material increases as wavelength shortens. Therefore, the pattern support substrate can be thickened, a heat can be exhausted by a thermal conduction of the pattern support substrate, and the rise in temperature of the pattern support substrate can be suppressed. For example, the transmittance of SiC with thickness of 2 μm for X-ray with wavelength of 1 nm is about 50%, but the slit support substrate with a radius of 0.5 mm can reduce the maximum temperature rise to 0.4 K or less, and is a tolerance.

Therefore, the problem of the rise in temperature of the pattern support substrate arranged in the vacuum is caused when the X-ray with wavelength at least of 1 to 50 nm is used as the exposure wavelength.

If a width of the slit support substrate 120 is thinned, the volume of the slit support substrate 120 becomes small. Therefore, a heat quantity generated by absorbing the EUV light raises the temperature of the slit support substrate 120, and causes a distortion in the slit support substrate 120.

In this case, a temperature at center ΔTmax that is the maximum temperature rise value of the slit support substrate 120 is shown by the following expression 1, where r is the radius of the slit support substrate 120, t is the thickness of the slit support substrate 120, λb is a thermal conductivity of the slit support substrate 120, and q is an incident light intensity.

$$\Delta T \max = q \times r^2 / (4 \times t \times \lambda b) \quad (1)$$

For example, when the slit support substrate 120 uses SiC substrate with r=0.5 mm and t=0.1 μm and the incident light intensity q=10 mW/cm² incident upon the slit support substrate 120, the thermal conductivity λb is 7.9 (J/m/sec/K), and the temperature at center ΔTmax is 8 K.

On the other hand, a distortion amount ΔL of the pattern is shown by the following expression 2, where α is a coefficient of linear thermal expansion, ΔT is a temperature rise value, and L is a length.

$$\Delta L = \alpha \times \Delta T \times L \quad (2)$$

For example, here, when a radius r (=0.5 mm) is taken as L, the coefficient of linear thermal expansion α is $3.3 \times 10^{-6}$, and ΔL is 1.6×ΔT (nm). If ΔT is 8 K, ΔL is 12 nm. Because the exposed stroke width is about 50 to 30 nm, the distortion amount is about ⅓ of the stroke width, and is not within the tolerance.

Then, in the instant embodiment, the gas exhausts the heat absorbed by the slit support substrate 120 to reduce the distortion amount, and the rise in the temperature of the slit support substrate 120 is suppressed. As a result, the alignment apparatus 100 can maintain high throughput and enables high accuracy alignment when the EUV light is used. A method of decreasing the distortion amount is described later.

The slit 125 shields the exposure light, and has a shape similar to the second reference pattern (reference pattern 227) used for the alignment. The slit 125 is formed to the slit support substrate 120, and the thickness is almost equal to the slit support substrate 120, for example, about 0.1 μm. The material of the slit 125 uses a metal such as Cr that shields the exposure light. Moreover, the shape of the slit 125 is decided based on the exposure light transformed by the reference pattern 227 described later. For example, when a reflection part of the reference pattern 227 is a line & space pattern of 200 nm, the exposure light becomes a line & space light of 50 nm on the waver stage 245 through the projection optical system 230 with reduction magnification of ¼. Therefore, in this case, the slit 125 such as Cr is desirable to the line & space of 50 nm.

The slit 125 by Cr is made according to the following processes. First, SiC is formed on a Si substrate, and Cr is formed by a technique such as EB deposition for instance. Afterwards, a resist is spread, the slit pattern is directly transferred by an electron beam etc., the slit is formed by an etching such as RIE, and the ring member 140 is bonded to a surface formed the slit. Finally, the Si substrate is etched, and a buck surface of SiC is exposed.

The detection part 130 detects the light that is reflected or transmitted through the slit support substrate 120. The detection part 130 is the photo-diode that has sensitivity for the EUV light in the instant embodiment, and is formed under the slit support substrate 120. As above-mentioned, the detection part 130 forms the hollow housing in cooperation with the slit support substrate 120. The detection part 120 has a size equal to the slit support substrate 120 or any more to receive the transmitted light from the slit support substrate 120. Moreover, the detection is electrically connected to the controller 170 described later.

The member 140 forms the hollow housing in cooperation with the slit support substrate 120 and the detection part 140. Therefore, the member 140 is formed to cover a side surface between the slit support substrate 120 and the detector part 130, and maintains the slit support substrate 120 on a top. The member 140 is composed of materials such as Si and SUS. The inlet (not shown) that introduces and exhausts the gas 150 described later is formed in the member 140. In this case, the inlet may be respectively different openings as for the introduction and the exhaust. Moreover, the member 140 has a sealing lid (not shown) that opens and shuts the inlet.

The gas 150 radiates the heat of the slit support substrate 120, and is introduced in the housing. The gas 150 uses hydrogen in the instant embodiment, may be other kinds of gases, and is not limited to hydrogen gas. For example, the gas 150 may be air. A thermal conductivity of air is about 0.024 W/mK, and is larger than hydrogen and helium. Therefore, if air is used, the rise in temperature of the slit support substrate 120 can be suppressed for the EUV light with large light intensity, and the heat distortion does not become the problem.

The gas 150 exhausts the heat quantity generated by absorbing the EUV light at the slit support substrate 120. Therefore, the gas 150 can prevent the rise in temperature of the slit support substrate 120 and prevent the distortion of the slit support substrate 120. Thus, the alignment error, distortion and defocus error decrease. As a result, the alignment apparatus 100 can maintain high throughput and enables high accuracy alignment when the EUV light is used.

The gas detection part 160 detects a pressure of the gas 150 in the housing. Therefore, the gas detection part 160 has a pressure sensor arranged in the housing. The gas detection part 160 is electrically connected to the controller 170.

The controller 170 controls the gas 150 and the wafer stage 245 based on detection results of the detection part 130 and the gas detection part 160. The controller 170 is electrically connected to the detection part 130, gas detection part 160 and wafer stage 245.

Hereafter, a description will be given of a method of decreasing the distortion amount.

In the instant embodiment, the distortion amount id decreased by an adjustment of a mean free path L of molecule or atom of the gas 150, the pressure of the gas 150, and a height H in incident direction of the exposure light in the housing (distance H between the slit support substrate 120 and the detection part 130).

The distance H between the slit support substrate 120 and the detection part 130 preferably is length of the mean free path L of molecule or atom of the gas 150 or more. This is because when the mean free path L is very shorter than the distance H of a space where the gas exists, the thermal conductivity is irrelevant to the pressure. Hereafter, a description will be given of the reason.

Figure 3:
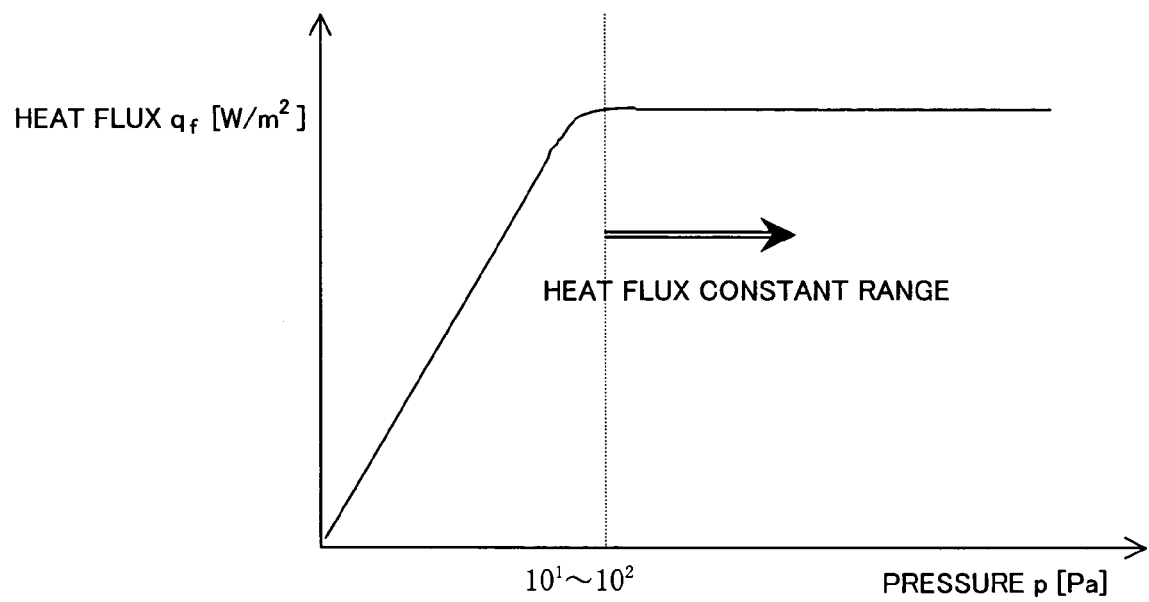
FIG. 3 is a graph of a relationship between a heat flux and a gas pressure.

Referring to FIG. 3, a description will be given of a relationship between a heat flux and a gas pressure. Here, FIG. 3 is a graph of the relationship between the heat flux and the gas pressure. The heat flux is a flow rate of the heat, and is a heat quantity deprived from an object of high temperature in the instant embodiment.

When the distance H is very smaller than the mean free path L (When the pressure is smaller than 10 [Pa]), the heat flux $q_f$ is shown by the following expression 3, where $\Delta T1$ is a temperature difference between an object of high temperature (the slit support substrate 120) and an object of the low temperature (the detection part 130), H is a distance between these objects, $q_f$ [W/m²] is the heat quantity deprived from the object of high temperature, and $\lambda$ is a thermal conductivity of a free molecule, and p is the pressure.

$$q_f = \lambda \times p \times \Delta T \quad (3)$$

The heat flux changes in proportion to the pressure as shown in FIG. 3.

On the other hand, when the distance H is larger than the mean free path L, the heat flux $q_f$ is shown by the following expression 4.

$$q_f = \lambda g / H \times \Delta T \quad (4)$$

The heat flux is constant regardless of the pressure as shown in FIG. 3.

When the distance H becomes almost same of the mean free path L, the thermal conductivity rapidly becomes small. Therefore, when the mean free path L of molecule is very shorter than the distance H of a space where the gas exists, the thermal conductivity is irrelevant to the pressure.

Moreover, the pressure of L<H is demanded to efficiently cause the thermal conduction in the gas. The shorter distance H can efficiently exhaust the heat. However, when the distance H is too short, a distance control is difficult. Thus, H=1 mm is suitable for the manufacturing.

The mean free path L of molecule is different each kind of the gas. For example, in hydrogen molecule, the mean free path L at 0.13 Pa is 90 mm. Moreover, the pressure of molecule and the mean free path L are relationship of inverse proportion. Therefore, when the distance H is 1 mm, the pressure of 12 Pa (≈0.13 Pa×90 mm/1 mm) or more is necessary. At this time, the temperature rise value $\Delta T$ of the slit support substrate 120 is shown by the following expression 5, where $\lambda g$ is a thermal conductivity of hydrogen gas, q is a light intensity, and S is a unit area.

$$\Delta T = q \times H / \lambda g \quad (5)$$

In this case, when the light intensity q is 100 W/m², the distance H is 1 mm, and the thermal conductivity is 0.18 (W/m/K), the temperature rise value $\Delta T$ becomes 0.6 K. When the calculation result is applied to the expression 2, the distortion amount $\Delta T$ becomes 1 nm. Thus, the distortion amount is smaller than the exposed stroke width, and is a disregarded value.

Concerning the pressure of the gas 150, the mean free path L of light elements such as hydrogen and helium is large, and the mean free path L of nitrogen and oxygen, etc., is small. Therefore, generally, the heat can be efficiently exhausted if there is the pressure of 10 Pa or more.

The slit support substrate 120 exhausts the heat quantity generated by absorbing the EUV light by these adjustments, prevents the rise temperature of the slit support substrate 120, and can prevent the distortion of the slit support substrate 120. As a result, the alignment apparatus 100 can maintain high throughput and enables high accuracy alignment when the EUV light is used.

The reference pattern 227 is formed on the mask 110 in the instant embodiment. However, the reference pattern 227 may be directly formed on the mask stage 225.

Figure 4:
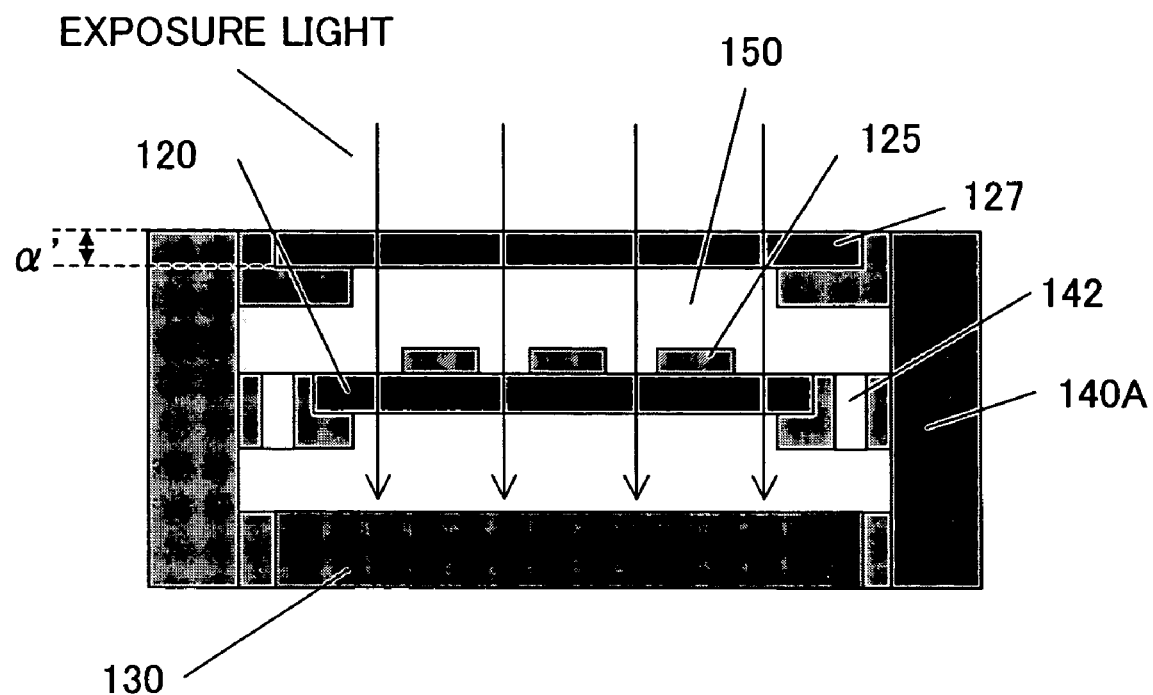
FIG. 4 is a partially enlarged sectional view of an alignment apparatus.

Referring to FIG. 4, a description will be given of an alignment apparatus 100A of a second embodiment. FIG. 4 is a structure view of the alignment apparatus 100A of the second embodiment.

The alignment apparatus 100A includes the above structure, an attenuating part 127, and a member 140A.

An attenuating part 127 attenuates an incident light that incident upon the slit support substrate 120. The material of the attenuating part 127 is selected from the material that transmits the exposure light similar to the slit support substrate 120. In this case, the material of the attenuating part 127 uses SiC.

An attenuating part 127 attenuates the light intensity of the EUV light absorbed by the slit 125 by attenuating the light intensity of the incident light to the slit. Thereby, the heat quantity caused by absorption can be decreased, and the rise in temperature of the slit support substrate 120 can be suppressed. When the light intensity on the detection part 130 decreases, a S/N ratio decreases at a same integration time. Therefore, it is necessary to set a lot of integration time. However, a frequency of the alignment between the wafer stage 245 and the mask stage 225 is not a lot, the throughput that is number of processed substrates at unit time is unaffected.

In the instant embodiment, both surfaces of the slit support substrate 120 are contact with the gases of the same pressure and kinds (for example, helium). When a distortion by a pressure difference between a front surface and a back surface of the slit support substrate 120 becomes a problem, the distortion of the slit support substrate 120 can be decreased or cancelled by contacting both surfaces of the substrate to the gas.

The member 140A forms the hollow housing in cooperation with an attenuating part 127 and the detection part 130. Therefore, the member 140A is formed to cover a side surface between the attenuating part 127 and the detection part 130, and maintains the attenuating part 127 on a top. The member 140A supports the slit support substrate 120 between the attenuating part 127 and the detection part 130, and a penetration hole 142 is formed in the supporting part. Therefore, the pressure difference of both surfaces of the slit support substrate 120 is lost, and it is more effective. The member 140A is composed of materials such as Si and SUS. The inlet (not shown) that introduces and exhausts the gas 150 is formed in the member 140A. In this case, the inlet may be respectively different openings as for the introduction and the exhaust. Moreover, the member 140A has a sealing lid (not shown) that opens and shuts the inlet.

Figure 5:
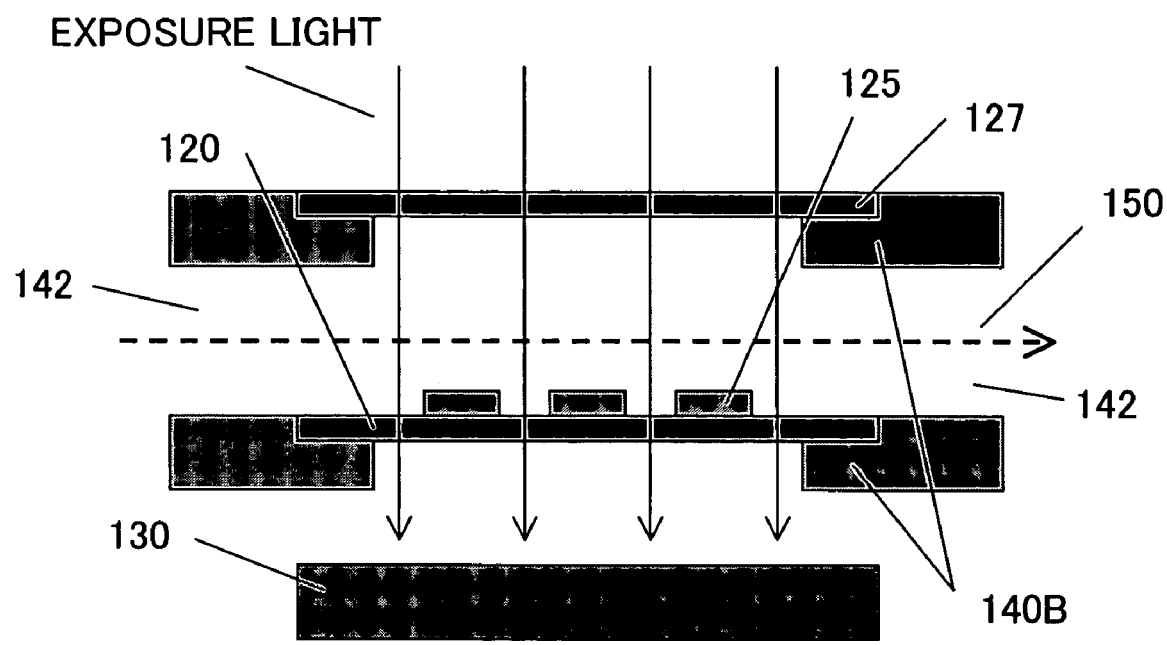
FIG. 5 is a partially enlarged sectional view of an alignment apparatus.

Referring to FIG. 5, a description will be given of an alignment apparatus 100B of a third embodiment. FIG. 5 is a structure view of the alignment apparatus 100B of the third embodiment.

The alignment apparatus 100B includes a member 140B that is a variation of the member 140A of the second embodiment.

The member 140B supports the slit support substrate 120 and an attenuating part 127. The inlet (not shown) that introduces and exhausts the gas 150 is formed in the member 140B. Moreover, the member 140B has a sealing lid (not shown) that opens and shuts the inlet.

The instant embodiment installs an attenuating part 127 on the slit support substrate 120, forms a space between the attenuating member 127 and the slit support substrate 120, and flows the gas 150 into the space. Flowing the gas 150 generates convection, and the heat can be efficiently exhausted. Moreover, the heat is not transmitted to the detection part 130, a temperature of the photo-diode does not rise, a thermal noise can be reduced, and the S/N ratio improves.

An attenuating part 127 may has a filter function that attenuates the light intensity. For example, if the attenuating part 127 is composed of a Zr film with thickness of 0.6 μm, the wavelength of 13.5 nm can be attenuated to 10%. In this case, most of the heat absorbed to the Zr film moves to an outside frame through the Zr film, and the heat of the Zr film is not transmitted to the slit support substrate 120. A distance between the slit support substrate 120 and the upper substrate may be longer than the distance between the slit support substrate 120 and the detection part 130. Thereby, the heat absorbed by the attenuating part 127 can be moved to the flame of the detection part 130 by the thermal conduction.

A description will be given below of an exposure apparatus 200 including the alignment apparatus 100 with reference to FIG. 6. Here, FIG. 6 is a structure view of the exposure apparatus 200 of one aspect according to the present invention.

The exposure apparatus 200 of the present invention uses the EUV light (with a wavelength of, e.g., 13.4 nm) as illumination light for exposure, and exposes onto an object 240 a circuit pattern created on a mask 220, for example, in a step-and-scan manner or step-and-repeat manner. This exposure apparatus is suitable for a lithography process less than submicron or quarter micron, and the present embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Figure 6:
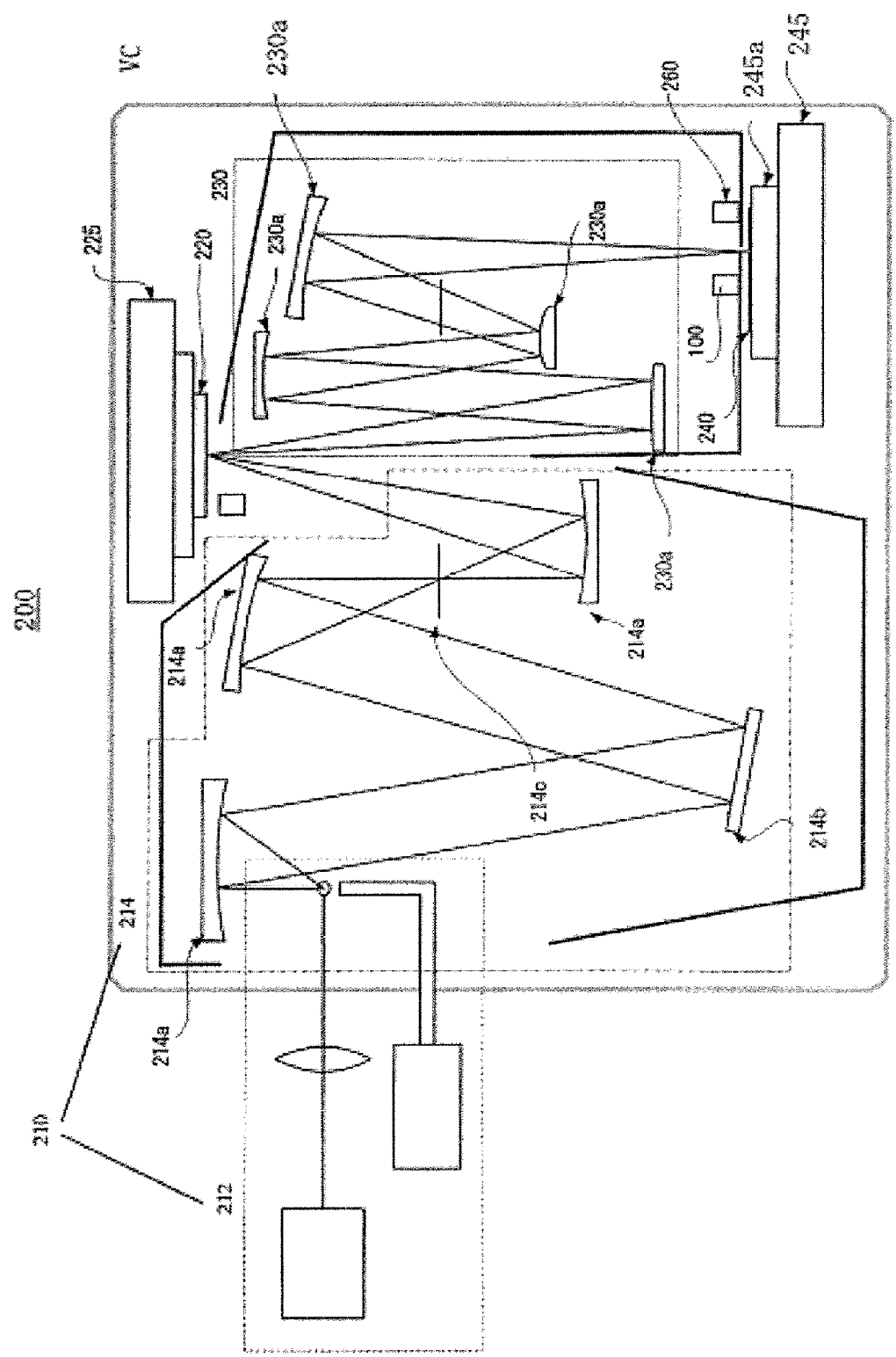
FIG. 6 is a schematic sectional view of an exposure apparatus.

Referring to FIG. 6, the exposure apparatus 200 includes an illumination optical system 210, a mask 220, a mask stage 225 for supporting the mask 220, a projection optical system 230, a wafer stage 245 for supporting the object 240, the alignment apparatus 100, and a focus position detecting mechanism 260.

As shown in FIG. 6, at least the optical path through which the EUV light travels, or the entire optical system, should preferably be maintained in a vacuum atmosphere by a vacuum chamber VC, since the EUV light has low transmittance to the air and causes contaminations in reaction with residue gas components, such as a polymer organic gas.

The illumination apparatus 210 uses the arc-shaped EUV light (with a wavelength of, for example, 13.4 nm) corresponding to an arc-shaped field in the projection optical system 230 to illuminate the mask 220, and includes the EUV light source 212 and an illumination optical system 214.

The EUV light source 212 uses, for example, a laser plasma light source. The laser plasma light source irradiates a highly intensified pulse laser beam to a target material put in vacuum, thus generating high-temperature plasma for use as EUV light with a wavelength of about 13 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 214 includes a condensing mirror 214a and an optical integrator 214b. The condenser mirror 214a serves to condense the EUV light that is radiated approximately isotropically from the laser plasma. The optical integrator 214b serves to uniformly illuminate the mask 220 at a predetermined NA. The illumination optical system 214 further includes an aperture (or a field stop) 214c for restricting the illumination area to the arc shape.

The mask 220 is a reflection type mask, and forms a circuit pattern (or image) to be transferred. It is supported and driven by the mask stage 225. The diffracted light emitted from the mask 120 is projected onto the object 240 after reflected by the projection optical system 230. The mask 220 and object 240 are arranged optically conjugate with each other. Since the exposure apparatus 200 of this embodiment is a scanner, the mask 220 and object 240 are scanned with a reduction speed ratio to transfer a pattern on the mask 220, onto the object 240.

The mask stage 225 supports the mask 220 and is connected to a moving mechanism (not shown). The mask stage 225 may use any structure known in the art. A moving mechanism (not shown) may include a linear motor etc., and drives the mask stage 225 at least in a direction X and moves the mask 220. The exposure apparatus 200 assigns the direction X to scan the mask 220 or the object 240, a direction Y perpendicular to the direction X, and a direction Z perpendicular to the mask 220 or the object 240.

The projection optical system 230 uses plural mirrors (multilayer mirrors) 230a to project a reduced size of a pattern on the mask 220 onto the object 240 on the image surface. The number of mirrors is about four to six. For wide exposure area with the small number of mirrors, the mask 220 and object 240 are simultaneously scanned to transfer a wide area that is a fine arc-shaped area or ring field apart from the optical axis by a predetermined distance. The projection optical system 230 has a NA of about 0.2 to 0.3 at the side of the object 240.

The object 240 is a wafer in this embodiment, but broadly covers a liquid crystal substrate and other objects to be exposed. A photoresist is applied to the object 240.

The object 240 to be exposed is held onto the wafer stage 245 by a wafer chuck 245a. The wafer stage 245 moves the object 240, for example, using a linear stage in XYZ directions. The mask 220 and the object 240 are synchronously scanned. The positions of the mask stage 225 and wafer stage 245 are monitored, for example, by a laser interferometer, and driven at a constant speed ratio.

The alignment apparatus 100 measures a positional relationship between the position of the mask 220 and the optical axis of the projection optical system 230, and a positional relationship between the position of the object 240 and the optical axis of the projection optical system 230, and sets positions and angles of the mask stage 225 and the wafer stage 245 so that a projected image of the mask 220 may be positioned in place on the object 240. The alignment apparatus 100 of the instant embodiment can maintain high throughput and enables high accuracy alignment when the EUV light is used.

The focus position detecting mechanism 260 measures a focus position in the direction Z on the object 240 surface, and control over a position and angle of the wafer stage 245 may always maintain the object 240 surface at an imaging position of the projection optical system 230 during exposure.

A description will be given below of alignment method.

First, the EUV light reflects at the mask 220 that has the reference pattern 227, incident upon the slit support substrate 120, is absorbed by the slit 125, transmits parts excluding the slit 125. The transmitted EUV light reaches the detection part 130, and is finally detected as a signal. The wafer stage 356 and the mask stage 225 is driven based on the detection signal, and is corrected to the desired exposure position.

When the slit 125 absorbs the EUV light, most of the absorbed energy is converted into heat energy. In the instant embodiment, the generated heat at this time is transmitted to the detection part 130 through the gas 150, and is dissipated to the back surface of the detection part 130. Thereby, the alignment apparatus 100 of the instant embodiment can maintain high throughput and enables high accuracy alignment when the EUV light is used.

In exposure, the EUV light emitted from the illumination apparatus 210 illuminates the mask 220, and images a pattern formed on the mask 220 onto the object 240 surface. The instant embodiment uses an arc or ring shaped image plane, scans the mask 220 and object 240 at a speed ratio corresponding to a reduction rate to expose the entire surface of the mask 220. The exposure apparatus 200 of the instant embodiment includes the alignment apparatus that can maintain high throughput and enables high accuracy alignment when the EUV light is used, and can be exposed in high accuracy.

Figure 7:
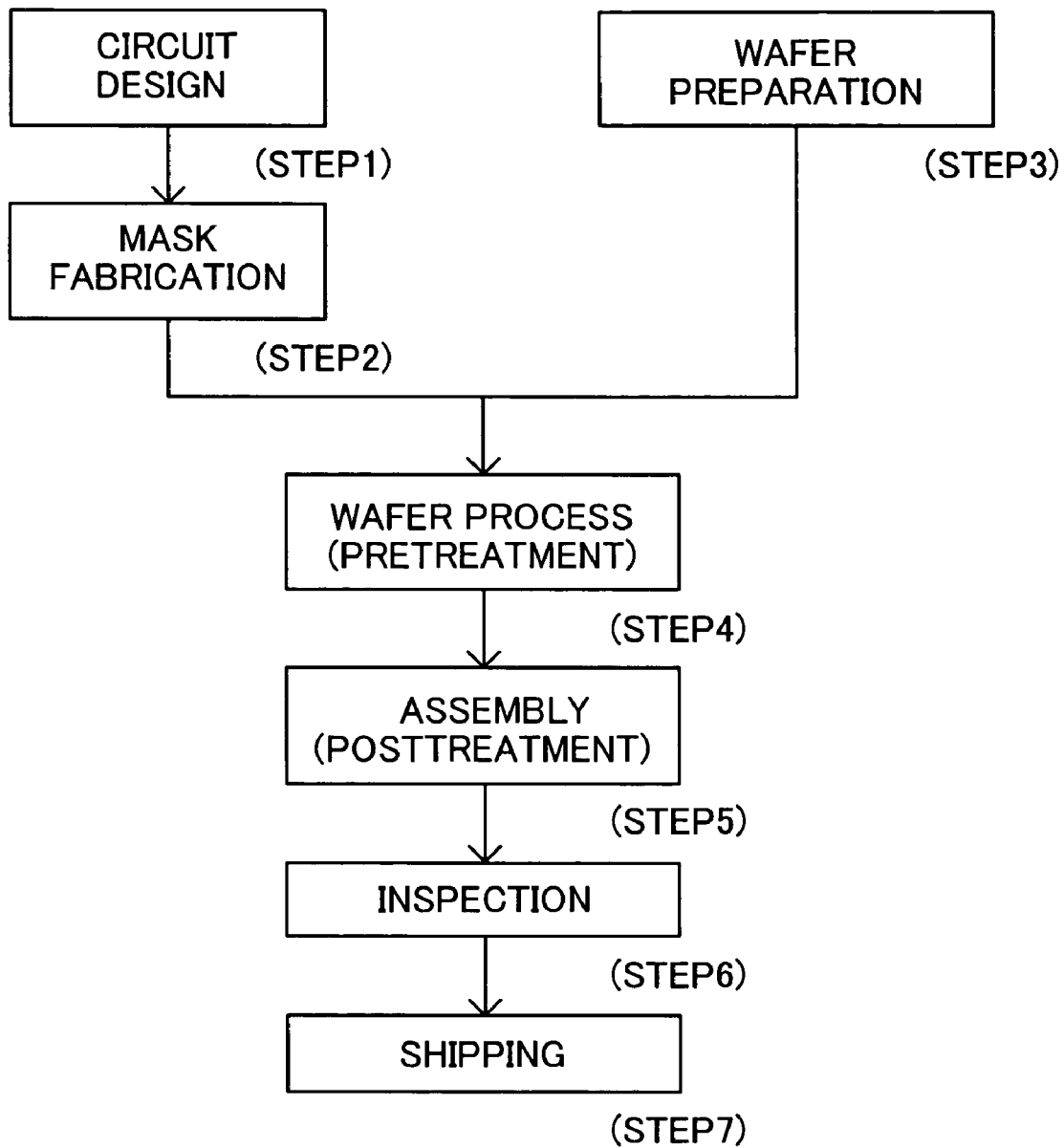
FIG. 7 is a flowchart for explaining how to fabricate devices.
Figure 8:
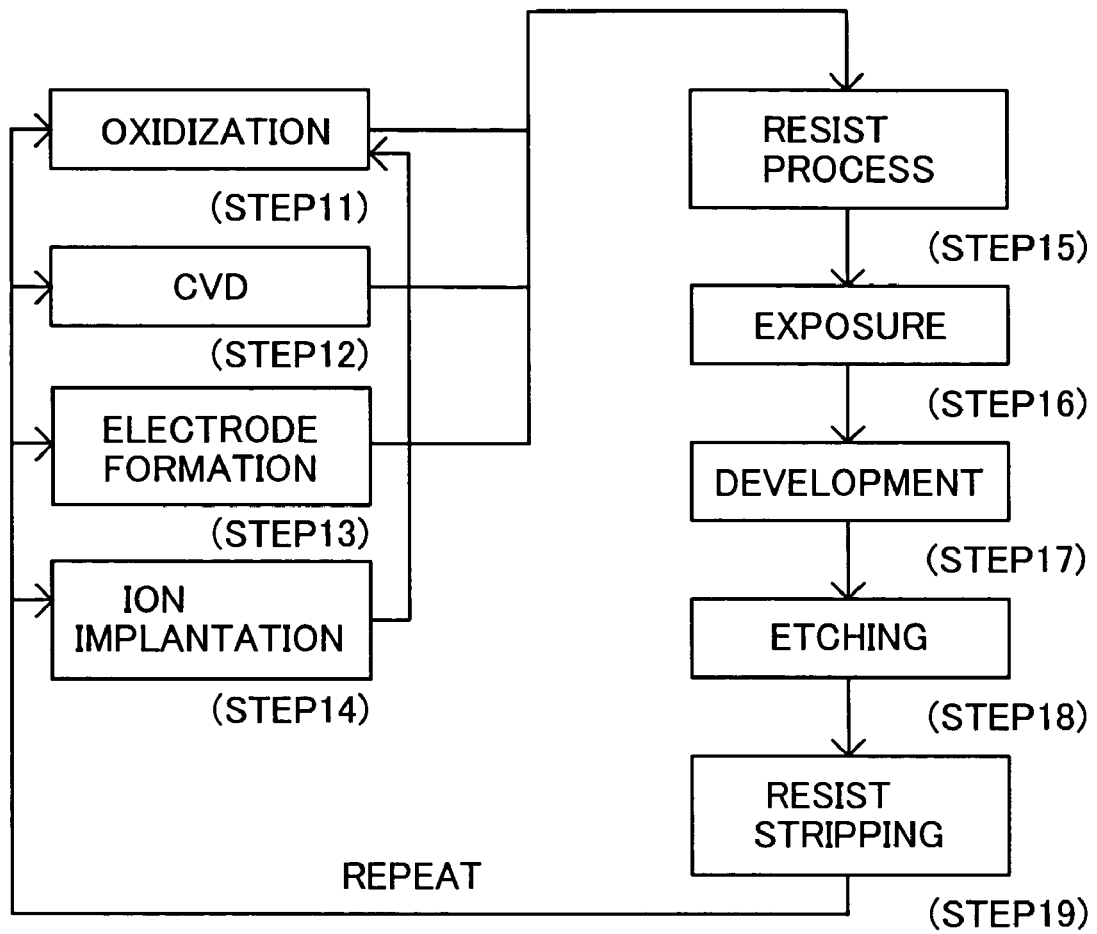
FIG. 8 is a detailed flowchart of a wafer process in step 4 in FIG. 7.

Referring now to FIGS. 7 and 8, a description will be given of an embodiment of a device fabricating method using the above exposure apparatus 200. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method. Thus, the device fabrication method using the exposure apparatus 200, and the devices as finished goods also constitute one aspect of the present invention.

The present invention provides an alignment apparatus that can maintain high throughput and enables high accuracy alignment when the EUV light is used.

Further, the present invention is not limited to these preferred embodiments, and various variations and modifications may be made without departing from the scope of the present invention.

This application claims a foreign priority benefit based on Japanese Patent Application No. 2004-253185, filed on Aug. 31, 2004, which is hereby incorporated by reference herein in its entirety as if fully set forth herein.

What is claimed is:

1. An alignment apparatus for aligning, by using a light with wavelength of 1 nm to 50 nm, a mask stage that supports a mask that has an exposure pattern and a wafer stage that supports an object with each other, said alignment apparatus comprising:

a substrate for forming a first reference pattern similar to a second reference pattern formed on the mask or the mask stage; and a detection part for detecting a light from the substrate, wherein said substrate and detection part form a hollow housing, in which a gas is filled, wherein a distance between the substrate and the detection part is the same as a mean free path of molecule or atom of the gas or more.

2. An alignment apparatus according to claim 1, wherein said gas is introduced to become the pressure of 10 Pa or more.

3. An alignment apparatus for aligning, by using a light with wavelength of 1 nm to 50 nm, a mask stage that supports a mask that has an exposure pattern and a wafer stage that supports an object with each other, said alignment apparatus comprising:

a substrate for forming a first reference pattern similar to a second reference pattern formed on the mask or the mask stage;

a detection part for detecting a light from the substrate; and an attenuating part for attenuating an incident light to the substrate, wherein said attenuating part and detection part forms a hollow housing, in which a gas is filled, and the substrate is arranged in the housing, wherein a distance between an attenuating part and the detection part is the same as a mean free path of molecule or atom of the gas or more.

4. An alignment apparatus according to claim 3, wherein said gas is introduced to become the pressure of 10 Pa or more.

5. An alignment apparatus for aligning, by using a light with wavelength of 1 nm to 50 nm, a mask stage that supports a mask that has an exposure pattern and a wafer stage that supports an object with each other, said alignment apparatus comprising:

a substrate for forming a first reference pattern similar to a second reference pattern formed on the mask or the mask stage;

a detection part for detecting a light from the substrate; and an attenuating part for attenuating an incident light to the substrate, wherein a gas is introduced into between the substrate and the attenuating part, wherein a distance between an attenuating part and the detection part is the same as a mean free path of molecule or atom of the gas or more.

6. An alignment apparatus according to claim 5, wherein said gas is introduced to become the pressure of 10 Pa or more.

7. An exposure apparatus for exposing a pattern of a mask supported by a mask stage onto an object supported by a wafer stage, said exposure apparatus comprising an alignment apparatus for aligning with each other the mask stage and the wafer stage, wherein said alignment apparatus includes:

a substrate for forming a first reference pattern similar to a second reference pattern formed on the mask or the mask stage; and a detection part for detecting a light from the substrate, wherein said substrate and detection part forms a hollow housing, in which a gas is filled, wherein a distance between the substrate and the detection part is the same as a mean free path of molecule or atom of the gas or more.

8. An exposure apparatus for exposing a pattern of a mask supported by a mask stage onto an object supported by a wafer stage, said exposure apparatus comprising an alignment apparatus for aligning with each other the mask stage and the wafer stage, wherein said alignment apparatus includes:

a substrate for forming a first reference pattern similar to a second reference pattern formed on the mask or the mask stage;

a detection part for detecting a light from the substrate; and an attenuating part for attenuating an incident light to the substrate, wherein said attenuating part and detection part forms a hollow housing, in which a gas is filled, and the substrate is arranged in the housing, wherein a distance between an attenuating part and the detection part is the same as a mean free path of molecule or atom of the gas or more.

9. An exposure apparatus for exposing a pattern of a mask supported by a mask stage onto an object supported by a wafer stage, said exposure apparatus comprising an alignment apparatus for aligning with each other the mask stage and the wafer stage, a substrate for forming a first reference pattern similar to a second reference pattern formed on the mask or the mask stage;

a detection part for detecting a light from the substrate; and an attenuating part for attenuating an incident light to the substrate, wherein a gas is introduced into between the substrate and the attenuating part, wherein a distance between an attenuating part and the detection part is the same as a mean free path of molecule or atom of the gas or more.

10. A device manufacturing method comprising the steps of:

exposing an object using an exposure apparatus; and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, wherein said alignment apparatus includes:

a substrate for forming a first reference pattern similar to a second reference pattern formed on the mask or the mask stage; and a detection part for detecting a light from the substrate, wherein said substrate and detection part forms a hollow housing, in which a gas is filled, wherein a distance between the substrate and the detection part is the same as a mean free path of molecule or atom of the gas or more.

11. A device manufacturing method comprising the steps of:

exposing an object using an exposure apparatus; and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, wherein said alignment apparatus includes:

a substrate for forming a first reference pattern similar to a second reference pattern formed on the mask or the mask stage;

a detection part for detecting a light from the substrate; and an attenuating part for attenuating an incident light to the substrate, wherein said attenuating part and detection part forms a hollow housing, in which a gas is filled, and the substrate is arranged in the housing, wherein a distance between an attenuating part and the detection part is the same as a mean free path of molecule or atom of the gas or more.

12. A device manufacturing method comprising the steps of:

exposing an object using an exposure apparatus; and performing a development process for the object exposed, wherein the exposure apparatus for exposing a pattern of a mask supported by a mask stage onto the object supported by a wafer stage, said exposure apparatus comprising an alignment apparatus for aligning with each other the mask stage and the wafer stage, a substrate for forming a first reference pattern similar to a second reference pattern formed on the mask or the mask stage;

a detection part for detecting a light from the substrate; and an attenuating part for attenuating an incident light to the substrate, wherein a gas is introduced into between the substrate and the attenuating part, wherein a distance between an attenuating part and the detection part is the same as a mean free path of molecule or atom of the gas or more.

\* \* \* \* \*